United States Patent
Prathipati (10) Patent No.: US 11,647,313 B2
(45) Date of Patent: May 9, 2023

(54) IMAGE SENSOR AMPLIFIERS WITH REDUCED INTER-CIRCULATION CURRENTS

(71) Applicant: SEMICONDUCTOR COMPONENTS INDUSTRIES, LLC, Phoenix, AZ (US)

(72) Inventor: Anilkumar Prathipati, Evere (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 288 days.

(21) Appl. No.: 16/948,724

(22) Filed: Sep. 30, 2020

(65) Prior Publication Data

US 2022/0103776 A1 Mar. 31, 2022

(51) Int. Cl.
 *H03F 3/45* (2006.01)
 *H04N 25/778* (2023.01)
 *H04N 25/75* (2023.01)

(52) U.S. Cl.
 CPC ....... *H04N 25/778* (2023.01); *H03F 3/45264* (2013.01); *H04N 25/75* (2023.01); *H03F 2200/129* (2013.01); *H03F 2203/45116* (2013.01)

(58) Field of Classification Search
 CPC ...... H04N 25/778; H04N 25/75; H04N 5/376; H03F 3/45264; H03F 2200/129; H03F 2203/45116; H03F 2203/45002; H03F 2203/45166; H03F 2203/45216; H03F 3/45188

See application file for complete search history.

(56) References Cited

U.S. PATENT DOCUMENTS

| | | | |
|---|---|---|---|
| 4,794,349 A | 12/1988 | Senderowicz et al. | |
| 6,466,093 B1 | 10/2002 | Yan | |
| 7,368,994 B2 | 5/2008 | Franck et al. | |
| 2008/0272845 A1 | 11/2008 | Willassen et al. | |
| 2014/0375384 A1 | 12/2014 | Bohannon et al. | |
| 2018/0330654 A1* | 11/2018 | Moon ................. | H01L 27/3276 |

OTHER PUBLICATIONS

Amourah et al. "A High Gain Strategy With Positive-Feedback Gain Enhancement Technique," Iowa State University, ISCAS2001.
Gabbouj, et al. "Low Voltage High Gain Linear Class AB CMOS OTA with DC Level Input Stage," International Journal of Electrical and Electronics Engineering 5:4, 2011.
Fujimori. "A 1.5 V, 4.1 mW Dual-Channel Audio Delta-Sigma D/A Converter," IEEE Journal of Solid-State Circuits, vol. 33, No. 12, Dec. 1998.

* cited by examiner

*Primary Examiner* — Jung Kim
(74) *Attorney, Agent, or Firm* — Treyz Law Group, P.C.; Jason Tsai (57) ABSTRACT

An image sensor may include an array of image sensor pixels. The array of image sensor pixels may be controlled by row driver circuitry. The row driver circuitry may include row drivers that receive power supply signals from transconductance amplifier circuitry. The transconductance amplifier circuitry may include multiple amplifiers with output ports shorted to one another. Each amplifier may include input transistors, cross-coupled transistors with a low threshold voltage, and additional transistors coupled in series with the cross-coupled transistors and having a moderate or high threshold voltage.

7 Claims, 5 Drawing Sheets

FIG. 5

IMAGE SENSOR AMPLIFIERS WITH REDUCED INTER-CIRCULATION CURRENTS

BACKGROUND

This relates generally to imaging devices, and more particularly, to image sensors that include row drivers.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Column circuitry is coupled to each pixel column for reading out pixel signals from the image pixels. Row control circuitry is coupled to each pixel row for resetting, initiating charge transfer, or selectively activating a particular row of pixels for readout. It can be challenging to design satisfactory row control circuitry for an image sensor.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
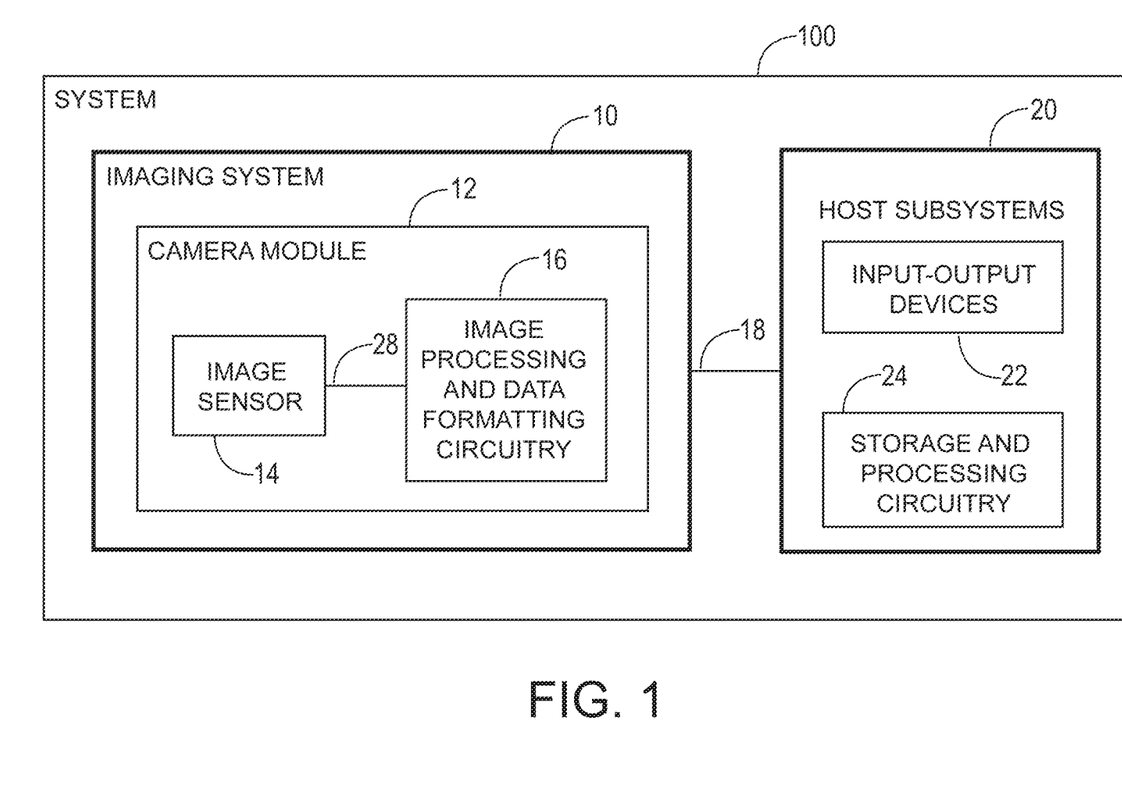
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
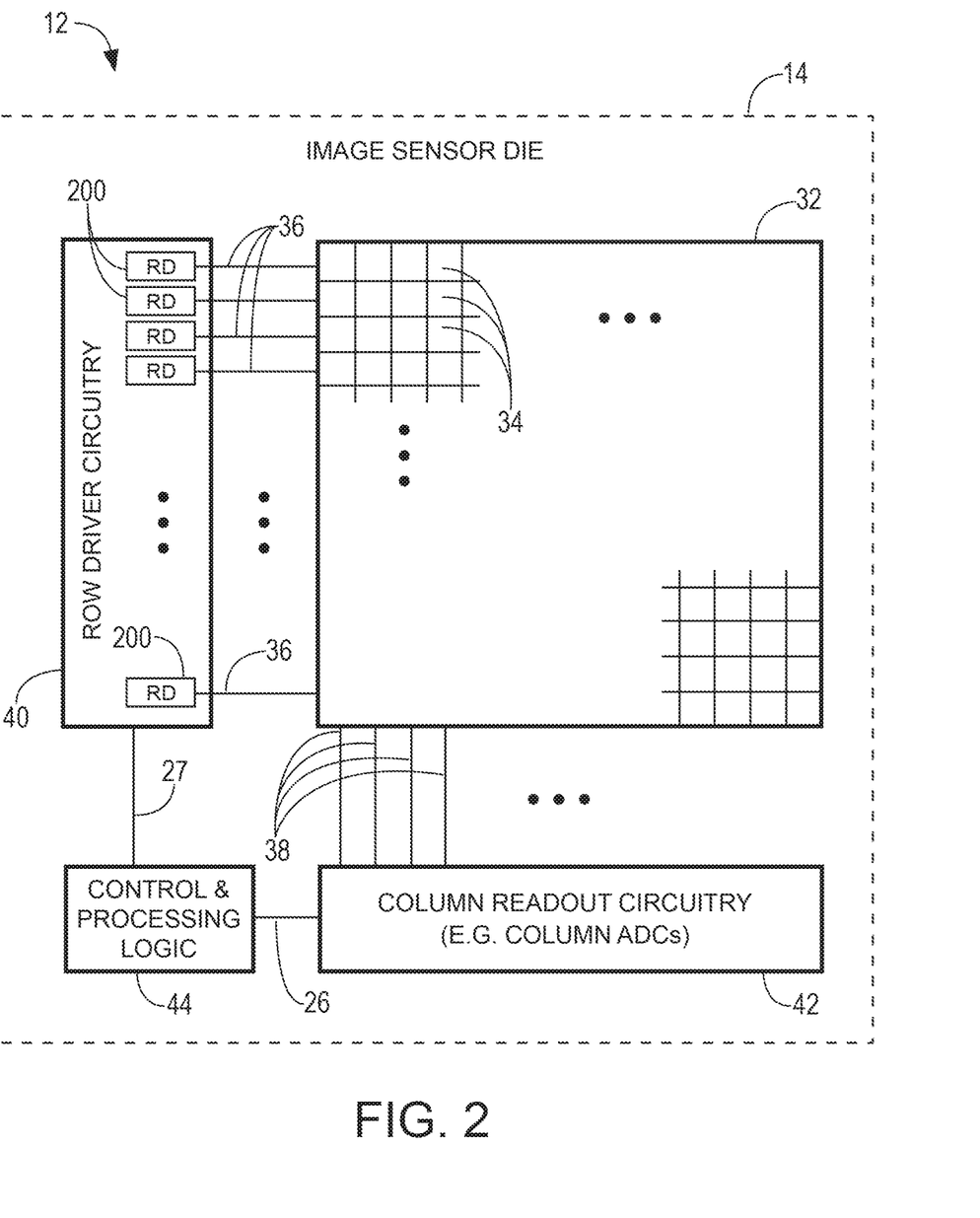
FIG. 2 is a diagram of an illustrative image pixel array and associated row and column control circuitry for accessing the image pixel array in accordance with some embodiments.

An example of an arrangement for camera module 12 of FIG. 1 is shown in FIG. 2. As shown in FIG. 2, camera module 12 includes image sensor 14 and control and processing circuitry 44. Control and processing circuitry 44 (sometimes referred to as control and processing logic) may correspond to image processing and data formatting circuitry 16 in FIG. 1. Image sensor 14 may include a pixel array such as array 32 of pixels 34 (sometimes referred to herein as image sensor pixels, imaging pixels, or image pixels 34). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals). Row control circuitry 40 includes individual row driver circuits 200 configured to generate these row control signals for each row of pixels and is therefore sometimes referred to as row driver circuitry. Although FIG. 2 shows only one row driver circuit 200 in a given row, each pixel row may actually include multiple row driver circuits each of which is responsible for generating a different row control signal (e.g., a reset control signal, a transfer control signal, a blooming control signal, a row select signal, etc.).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Figure 3:
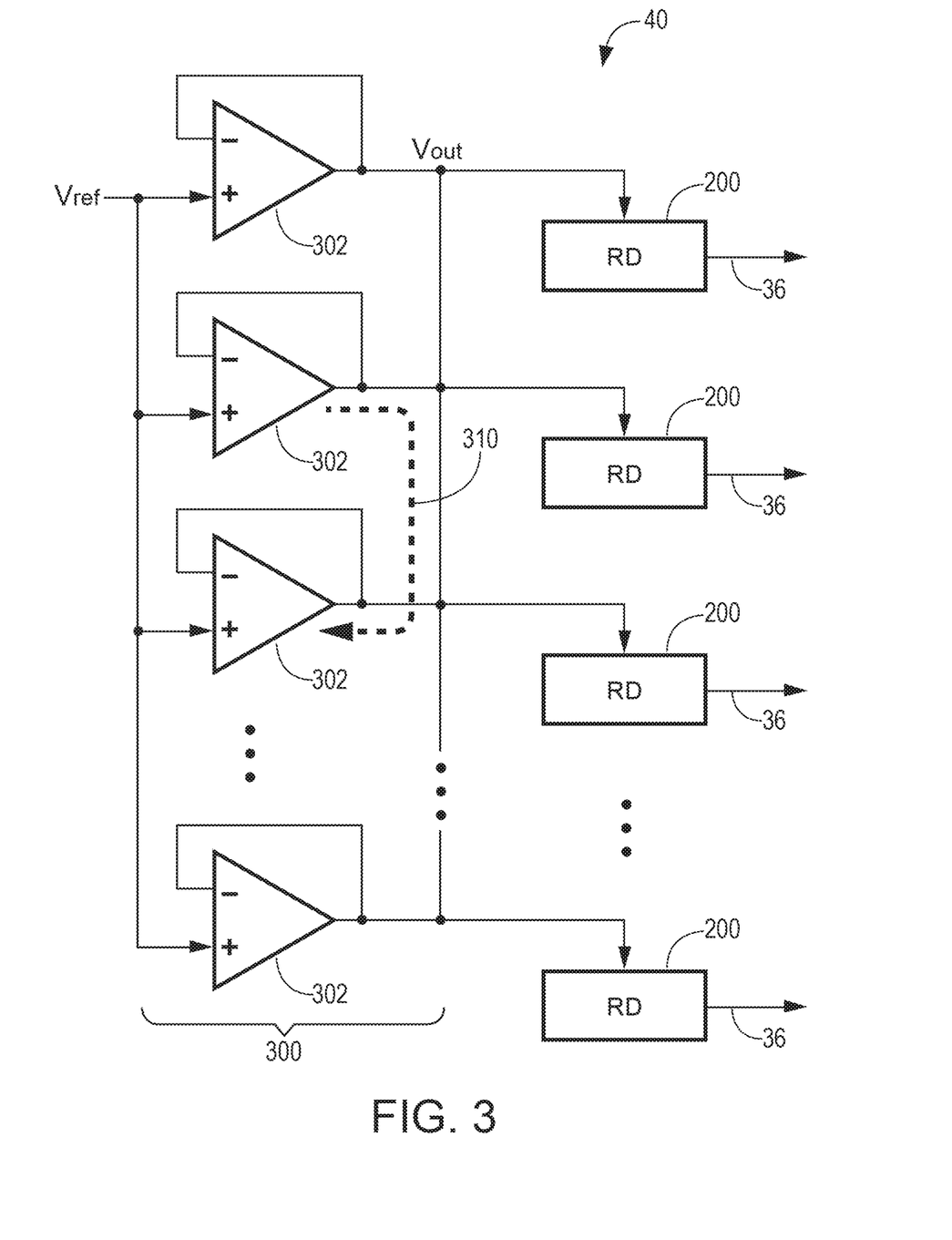
FIG. 3 is a diagram of illustrative row driver circuitry having amplifiers configured to provide power supply signals to row driver circuits in accordance with some embodiments.

FIG. 3 is a diagram showing how row driver circuitry 40 may include amplifiers 302 configured to provide power supply signals to row driver circuits 200. As shown in FIG. 3, amplifiers 302 (sometimes referred to collectively as amplifier circuitry 300) may be configured to generate an output voltage signal Vout that is used to power the row driver circuits 200. Each row driver 200 may have a positive power supply terminal that receives voltage Vout from amplifier circuitry 300. Voltage signal Vout may sometimes be referred to as an amplifier output voltage signal. Amplifiers 302 operated in this way to provide supply voltage Vout to power row driver circuits 200 are sometimes referred to as row driver power supply amplifiers. Each row driver power supply amplifier 302 may include a first (positive) input port configured to reference a reference voltage Vref, a second (negative) input port, and an output port on which voltage Vout is generated. The output port may be shorted to the input port in a negative feedback configuration.

Amplifier circuitry 300 is often used to drive a variable resistive-capacitive (RC) load to meet image sensor readout performance criteria. The variable RC load can be foreseen due to different image array sizes depending on the user application. To help drive higher RC loads, the output ports of amplifiers 302 may be shorted together to help satisfy speed requirements. Amplifiers 302 may be implemented as class AB amplifiers, which can provide higher instantaneous slew currents and allows for faster signal settling time. If care is not taken, however, conventional class AB amplifiers can draw higher quiescent currents depending on the amount of direct-current (DC) mismatch or offset between the shorted amplifiers and depending on the DC gain of those amplifiers. This may result in inter-circulation currents such as current 310 to flow between the outputs of the shorted amplifiers and can undesirably increase power consumption.

Figure 4:
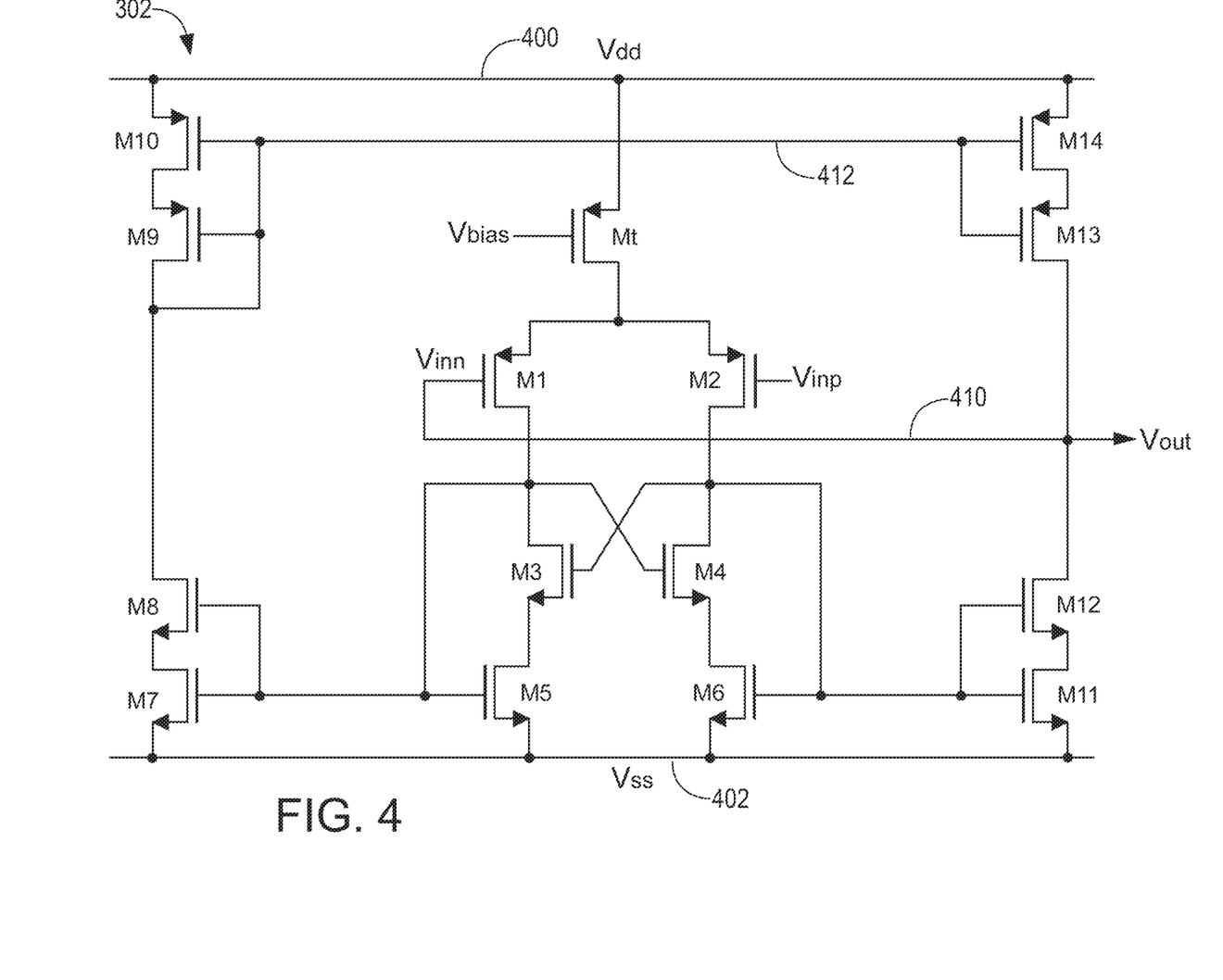
FIG. 4 is a circuit diagram of an illustrative p-type row driver amplifier in accordance with some embodiments.

In accordance with an embodiment, FIG. 4 is a circuit diagram of an illustrative p-type row driver amplifier 302 configured to mitigate the inter-circulation currents among the shorted amplifier output ports. As shown in FIG. 4, amplifier 302 may include transistors Mt and M1-M14. Transistor Mt may be a p-type transistor (e.g., a p-channel transistor such as a p-type metal-oxide-semiconductor or PMOS transistor) having a source terminal coupled to a positive power supply line 400 (e.g., a positive power supply terminal on which positive power supply voltage Vdd or some other voltage that is greater or less than Vdd is provided), a gate terminal configured to receive a tail transistor biasing voltage Vbias and a drain terminal. For example, if voltage Vdd is 2.8 V, the voltage on power supply line 400 can be 2.8 V, 3.2 V, 3.6 V, 4 V, 2.8-4 V, greater than 2.8 V, greater than 4 V, less than 2.8 V, 2.6 V, 2.4 V, 2-2.8 V, or other suitable high voltage level. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

Transistor M1 may be a p-type transistor (e.g., a PMOS device) having a source terminal coupled to the drain terminal of transistor Mt, a gate terminal configured as a negative (−) input port of amplifier 302 to receive negative input voltage Vinn, and a drain terminal. The negative input port of amplifier 302 may be shorted to the output port of amplifier 302, as shown by negative feedback path 410. Transistor M2 may also be a p-type transistor (e.g., a PMOS device) having a source terminal coupled to the drain terminal of transistor Mt, a gate terminal configured as a positive (+) input port of amplifier 302 to receive positive input voltage Vinp, and a drain terminal. Transistors M1 and M2 are sometimes referred to as input transistors or input switches. Voltage Vinp may be set to a reference voltage level Vref (see, e.g., FIG. 3).

Transistor M3 may be an n-type transistor (e.g., an n-channel transistor such as an n-type metal-oxide-semiconductor or NMOS transistor) having a drain terminal coupled to the drain terminal of transistor M1, a gate terminal cross-coupled to the drain terminal of transistor M2, and a source terminal. Transistor M3 is connected in series with transistor M1. Transistor M4 may also be an n-type transistor (e.g., an NMOS transistor) having a drain terminal coupled to the drain terminal of transistor M2, a gate terminal cross-coupled to the drain terminal of transistor M1, and a source terminal. Transistor M4 is connected in series with transistor M2. Configured in this way, transistors M3 and M4 are considered cross-coupled transistors or cross-coupled switches.

Transistor M5 may be an n-type transistor (e.g., an NMOS transistor) having a drain terminal coupled to the source terminal of transistor M3, a gate terminal coupled to the drain terminal of transistor M3, and a source terminal coupled to a ground line 402 (e.g., a ground power supply line on which ground voltage signal Vss is provided). Transistor M5 is connected in series with transistor M3. Transistor M6 may also be an n-type transistor (e.g., an NMOS transistor) having a drain terminal coupled to the source terminal of transistor M4, a gate terminal coupled to the drain terminal of transistor M4, and a source terminal coupled to ground line 402. Transistor M6 is connected in series with transistor M4. Ground voltage signal Vss may be 0 V, 1 V, 2 V, −1 V, −2 V, or other suitable low or negative voltage level.

The gate terminal of transistor M5 may be coupled to gate terminals of additional biasing transistors M7 and M8 (e.g., n-type biasing transistors). Transistors M7 and M8 may be coupled in series with p-type biasing transistors M9 and M10. Similarly, the gate terminal of transistor M6 may be coupled to gate terminals of additional biasing transistors M11 and M12 (e.g., n-type biasing transistors). Transistors M11 and M12 may be coupled in series with p-type biasing transistors M13 and M14. The gate terminals of p-type biasing transistors M9, M10, M13, and M14 may all be shorted together via connection path 412. The node interposed between the drain terminals of transistors M12 and M13 serves as the output port of amplifier 302 on which amplifier output signal Vout is generated. Transistors M12 and M13 coupled to the output port in this way are sometimes referred to as cascode transistors or cascode switches and are optionally include to help increase the output impedance of amplifier 302, which boosts the overall gain of amplifier 302.

In accordance with an embodiment, cross-coupled transistor M3 and M4 may be provided with a first threshold voltage level Vth1, whereas transistors M5 and M6 are provided with a second threshold voltage level Vth2 that is different than the first threshold voltage level Vth1. In particular, threshold voltage Vth1 of transistors M3 and M4 should be less than threshold voltage Vth2 of transistor M5 and M6. Implementing cross-coupled transistors M3 and M4 with a relatively lower threshold voltage enables these cross-coupled transistors to provide a small signal gain instead of acting like a digital comparator. In one example, the input transistors M1 and M2 may exhibit the higher threshold voltage Vth1. In another example, the input transistors M1 and M2 may exhibit the lower threshold voltage Vth2.

When the differential input voltage (i.e., the difference between Vinp and Vinn) is less than 2*Vdsat, where Vdsat is defined as the minimum drain-to-source voltage required to maintain the input transistors in the saturation region, differential current will flow through both of input transistors M1 and M2 and cross-coupled transistors M3 and M4 are not triggered to perform any push-pull (class AB) action. Voltage Vdsat is sometimes referred to as an input transistor overdrive voltage and can be equal to 0.1 V, 0.2 V, 0.05-0.15 V, 0.02-0.2 V, less than 0.1 V, greater than 0.1 V, 0.01-0.5V, 0.05-1 V, or other suitable voltage. Thus, when the differential input voltage is less than 2*Vdsat, amplifier 302 will operate as a normal symmetrical operational transconductance amplifier to provide a gain that is proportional to the transconductance (sometimes referred to as "gm") of the input transistors and the output impedance at the output port. Since the cross-coupled transistors M3 and M4 are not triggered in this mode, the gain is independent of the positive feedback loop of the cross-coupled switches and will therefore be less prone to variations in the cross-coupled switches. Operating amplifier 302 in this way provides enhance tolerance for DC mismatches since DC mismatches are generally expected to be less than 2*Vdsat (e.g., DC mismatches or offset are generally less than 0.2 V, less than 0.1 V, less than 0.3 V, less than 0.4 V, etc.). As a result, DC offset inter-circulation currents can be reduced or minimized.

When the differential input voltage (i.e., Vinp minus Vinn) is greater than 2*Vdsat, the input bias current will be completely steered to through either transistor M1 or transistor M2. Operated in this way, the cross-coupled transistors M3 and M4 will be triggered to provide the desired push-pull (class AB) action to provide high slew currents to the output port for large signal output disturbances.

Amplifier 302 of FIG. 4 is sometimes referred to as a single dominant pole class AB amplifier that is stable and provides sufficient gain and phase margin. Amplifier 302 may be capable of providing a gain that is greater than 60 dB, greater than 50 dB, greater than 40 dB, greater than 30 dB, between 50-70 dB, between 40-80 dB, 30-90 dB, 60-70 dB, 60-80 dB, 60-90 dB, 60-100 dB, or greater than 100 dB of gain.

Figure 5:
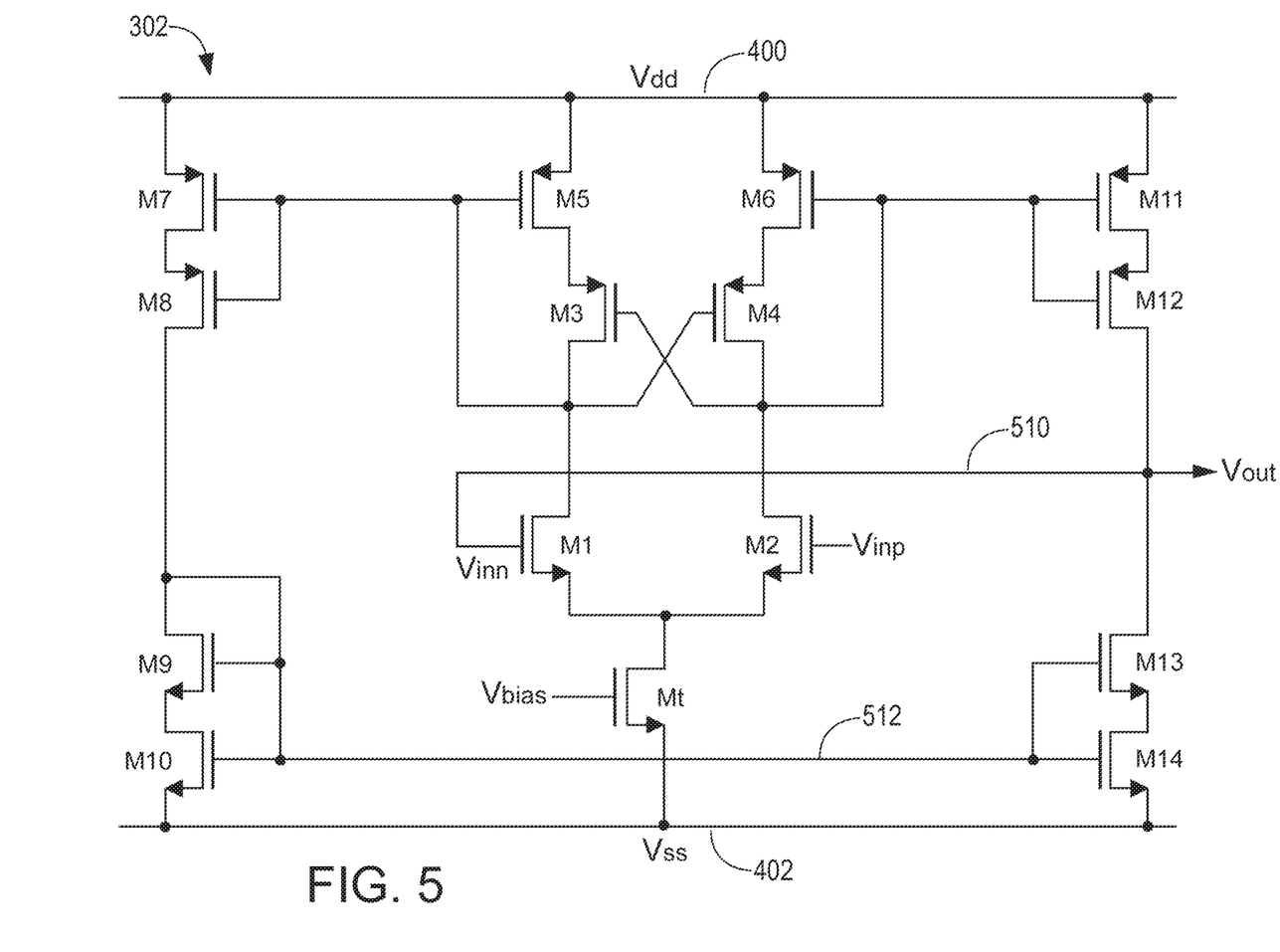
FIG. 5 is a circuit diagram of an illustrative n-type row driver amplifier in accordance with some embodiments.

The example of FIG. 4 in which input transistors M1 and M2 are implemented as p-type transistors is merely illustrative. Amplifier 302 of FIG. 4 is therefore sometimes referred to as a p-type operational transconductance amplifier. In accordance with another suitable embodiment, FIG. 5 shows an illustrative n-type row driver amplifier 302 where the input transistors are implemented as n-type transistors. As shown in FIG. 5, n-type operational transconductance amplifier 302 may include transistors Mt and M1-M14. Transistor Mt may be an n-type transistor (e.g., an NMOS transistor) having a source terminal coupled to ground power supply line 402, a gate terminal configured to receive a tail transistor biasing voltage Vbias and a drain terminal.

Transistor M1 may be an n-type transistor (e.g., an NMOS device) having a source terminal coupled to the drain terminal of transistor Mt, a gate terminal configured as a negative (−) input port of amplifier 302 to receive negative input voltage Vinn, and a drain terminal. The negative input port of amplifier 302 may be shorted to the output port of amplifier 302, as shown by negative feedback path 510. Transistor M2 may also be an n-type transistor (e.g., an NMOS device) having a source terminal coupled to the drain terminal of transistor Mt, a gate terminal configured as a positive (+) input port of amplifier 302 to receive positive input voltage Vinp, and a drain terminal. Transistors M1 and M2 are sometimes referred to as input transistors or input switches.

Transistor M3 may be a p-type transistor (e.g., a PMOS transistor) having a drain terminal coupled to the drain terminal of transistor M1, a gate terminal cross-coupled to the drain terminal of transistor M2, and a source terminal. Transistor M3 is connected in series with transistor M1. Transistor M4 may also be a p-type transistor (e.g., a PMOS transistor) having a drain terminal coupled to the drain terminal of transistor M2, a gate terminal cross-coupled to the drain terminal of transistor M1, and a source terminal. Transistor M4 is connected in series with transistor M2. Configured in this way, transistors M3 and M4 are considered p-type cross-coupled transistors or cross-coupled switches.

Transistor M5 may be a p-type transistor (e.g., a PMOS transistor) having a drain terminal coupled to the source terminal of transistor M3, a gate terminal coupled to the drain terminal of transistor M3, and a source terminal coupled to power supply line 400. Transistor M5 is connected in series with transistor M3. Transistor M6 may also be a p-type transistor (e.g., a PMOS transistor) having a drain terminal coupled to the source terminal of transistor M4, a gate terminal coupled to the drain terminal of transistor M4, and a source terminal coupled to power supply line 400. Transistor M6 is connected in series with transistor M4.

The gate terminal of transistor M5 may be coupled to gate terminals of additional biasing transistors M7 and M8 (e.g., p-type biasing transistors). Transistors M7 and M8 may be coupled in series with n-type biasing transistors M9 and M10. Similarly, the gate terminal of transistor M6 may be coupled to gate terminals of additional biasing transistors M11 and M12 (e.g., p-type biasing transistors). Transistors M11 and M12 may be coupled in series with n-type biasing transistors M13 and M14. The gate terminals of n-type biasing transistors M9, M10, M13, and M14 may all be shorted together via connection path 512. The node interposed between the drain terminals of transistors M12 and M13 serves as the output port of amplifier 302 on which amplifier output signal Vout is generated. Transistors M12 and M13 coupled to the output port in this way are sometimes referred to as cascode transistors or cascode switches and are optionally include to help increase the output impedance of amplifier 302, which boosts the overall gain of amplifier 302.

In accordance with an embodiment, cross-coupled transistor M3 and M4 may be provided with a first threshold voltage level Vth1 (e.g., a moderate or high threshold voltage magnitude), whereas transistors M5 and M6 are provided with a second threshold voltage level Vth2 (e.g., a low threshold voltage magnitude) that is different than the first threshold voltage level Vth1. In particular, the magnitude of threshold voltage Vth1 of transistors M3 and M4 should be less than the magnitude of threshold voltage Vth2 of transistor M5 and M6. Implementing cross-coupled transistors M3 and M4 with a relatively lower threshold voltage magnitude enables these cross-coupled transistors to provide a small signal gain instead of acting like a digital comparator. In one example, the input transistors M1 and M2 may exhibit the higher threshold voltage Vth1. In another example, the input transistors M1 and M2 may exhibit the lower threshold voltage Vth2.

When the differential input voltage (i.e., the difference between Vinp and Vinn) is less than 2*Vdsat, where Vdsat is defined as the minimum drain-to-source voltage required to maintain the input transistors in the saturation region, differential current will flow through both of input transistors M1 and M2 and cross-coupled transistors M3 and M4 are not triggered to perform any push-pull (class AB) action. Voltage Vdsat is sometimes referred to as an input transistor overdrive voltage and can be equal to 0.1 V, 0.2 V, 0.05-0.15 V, 0.02-0.2 V, less than 0.1 V, greater than 0.1 V, 0.01-0.5V, 0.05-1 V, or other suitable voltage. Thus, when the differential input voltage is less than 2*Vdsat, amplifier 302 will operate as a normal symmetrical operational transconductance amplifier to provide a gain that is proportional to the transconductance (sometimes referred to as "gm") of the input transistors and the output impedance at the output port. Since the cross-coupled transistors M3 and M4 are not triggered in this mode, the gain is independent of the positive feedback loop of the cross-coupled switches and will therefore be less prone to variations in the cross-coupled switches. Operating amplifier 302 in this way provides enhance tolerance for DC mismatches since DC mismatches are generally expected to be less than 2*Vdsat (e.g., DC mismatches or offset are generally less than 0.2 V, less than 0.1 V, less than 0.3 V, less than 0.4 V, etc.). As a result, DC offset inter-circulation currents can be reduced or minimized.

When the differential input voltage (i.e., Vinp minus Vinn) is greater than 2*Vdsat, the input bias current will be completely steered to through either transistor M1 or transistor M2. Operated in this way, the cross-coupled transistors M3 and M4 will be triggered to provide the desired push-pull (class AB) action to provide high slew currents to the output port for large signal output disturbances.

Amplifier 302 of FIG. 5 may sometimes be referred to as a single dominant pole class AB amplifier that is stable and provides sufficient gain and phase margin. Amplifier 302 may be capable of providing a gain that is greater than 60 dB, greater than 50 dB, greater than 40 dB, greater than 30 dB, between 50-70 dB, between 40-80 dB, 30-90 dB, 60-70 dB, 60-80 dB, 60-90 dB, 60-100 dB, or greater than 100 dB of gain.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an array of image sensor pixels;
   a plurality of row drivers configured to provide row control signals to the array of image sensor pixels;
   a first amplifier having a first output coupled to a first power supply terminal of a first row driver in the plurality of row drivers; and
   a second amplifier having a second output coupled to the first output and coupled to a second power supply terminal of a second row driver in the plurality of row drivers, wherein each of the first amplifier and the second amplifier comprises:
   a first transistor having a first channel type and having a gate terminal configured as a first amplifier input port;
   a second transistor having the first channel type and having a gate terminal configured as a second amplifier input port;
   a third transistor having a second channel type different than the first channel type, the third transistor being coupled in series with the first transistor; and a fourth transistor having the second channel type, the fourth transistor being coupled in series with the second transistor and cross-coupled with the third transistor.

2. The image sensor of claim 1, wherein each of the first amplifier and the second amplifier further comprises:
   a fifth transistor having the second channel type and a first threshold voltage level, wherein the fifth transistor is coupled in series with the third transistor and wherein the third transistor has a second threshold voltage level less than the first threshold voltage level; and
   a sixth transistor having the second channel type and the first threshold voltage level, wherein the sixth transistor is coupled in series with the fourth transistor and wherein the fourth transistor has the second threshold voltage level.

3. The image sensor of claim 2, wherein:
   the fifth transistor has a gate terminal that is coupled to a drain terminal of the third transistor; and
   the sixth transistor has a gate terminal that is coupled to a drain terminal of the fourth transistor.

4. The image sensor of claim 1, wherein each of the first amplifier and the second amplifier further comprises:
   a fifth transistor having the second channel type and a first threshold voltage level, wherein the fifth transistor is coupled in series with the third transistor and wherein the third transistor has a second threshold voltage different than the first threshold voltage level; and
   a sixth transistor having the second channel type and the first threshold voltage level, wherein the sixth transistor is coupled in series with the fourth transistor and wherein the fourth transistor has the second threshold voltage level.

5. The image sensor of claim 1, wherein each of the first amplifier and second amplifier comprises:
   a tail transistor coupled to a source terminal of the first transistor and to a source terminal of the second transistor.

6. The image sensor of claim 1, wherein:
   the first amplifier input port of the first amplifier is shorted to the first output; and
   the first amplifier input port of the second amplifier is shorted to the second output.

7. The image sensor of claim 1, wherein:
   the second amplifier input port of the first amplifier is configured to receive a reference voltage; and
   the second amplifier input port of the second amplifier is configured to receive the reference voltage.

\* \* \* \* \*